United States Patent
Forstner

(10) Patent No.: US 9,577,647 B2
(45) Date of Patent: Feb. 21, 2017

(54) SYSTEMS AND METHODS FOR TEMPERATURE COMPENSATED OSCILLATORS HAVING LOW NOISE

(71) Applicant: Infineon Technologies AG, Neubiberg (DE)

(72) Inventor: Johann Peter Forstner, Steinhoering (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/700,739

(22) Filed: Apr. 30, 2015

(65) Prior Publication Data

US 2016/0322977 A1    Nov. 3, 2016

(51) Int. Cl.
*H03L 1/00* (2006.01)
*H03L 1/02* (2006.01)

(52) U.S. Cl.
CPC .............. *H03L 1/022* (2013.01); *H03L 1/02* (2013.01)

(58) Field of Classification Search
CPC .................................. H03L 1/022; H03L 1/02
USPC .................................................... 331/66, 176
See application file for complete search history.

(56) References Cited

U.S. PATENT DOCUMENTS

| | | | |
|---|---|---|---|
| 4,978,930 A | 12/1990 | Suter | |
| 7,116,180 B2* | 10/2006 | Hamaguchi | H03B 5/1228 331/175 |
| 2003/0155984 A1* | 8/2003 | Kubo | H03B 5/368 331/158 |
| 2005/0231297 A1* | 10/2005 | Aparin | H03L 7/099 331/177 V |
| 2011/0234293 A1* | 9/2011 | Shanan | H03B 19/00 327/361 |
| 2011/0273333 A1* | 11/2011 | Terasawa | G01S 19/34 342/357.77 |
| 2013/0214695 A1* | 8/2013 | Sadwick | H05B 33/08 315/224 |

\* cited by examiner

*Primary Examiner* — Richard Tan
(74) *Attorney, Agent, or Firm* — Eschweiler & Potashnik, LLC

(57) ABSTRACT

A voltage controlled oscillator arrangement is disclosed. The arrangement includes a voltage controlled oscillator and a bypass component. The voltage controlled oscillator has an output and a tuning port. The output provides an output signal at an operating frequency. The tuning port is configured to select the operating frequency according to an applied voltage. The voltage controlled oscillator has active portions and inactive portions. During the active portions, the output signal is at a non-zero value. The bypass component is configured to apply a bypass compensating signal to the tuning port during the active portions of the voltage controlled oscillator. The bypass compensating signal compensates for an oscillator temperature of the voltage controlled oscillator.

18 Claims, 5 Drawing Sheets

SYSTEMS AND METHODS FOR TEMPERATURE COMPENSATED OSCILLATORS HAVING LOW NOISE

BACKGROUND

Signal oscillators, such as RF signal oscillators, are used in a wide variety of applications. The applications include, for example, signal processing, data communication, circuitry testing, object detection and the like. A key characteristic is that the signal oscillators generate an oscillation signal having a stable oscillation frequency. Otherwise processing errors, communication errors, object detection and the like may not be suitably performed.

One environmental condition that impacts the oscillation signal is temperature. Changes in temperature result in unwanted changes in the oscillation frequency. The change is referred to as temperature drift.

One technique to compensate for temperature drift in voltage controlled oscillators (VCO) is to use a phase locked loop (PLL). This technique can compensate for temperature drift, however adding a PLL to a circuit adds complexity and cost. An alternative for frequency stabilization of a VCO is the use of high Q (dielectric) resonators with appropriate temperature coefficient. However, cost and effort for frequency centering by laser are high.

What is needed are techniques to mitigate or account for temperature drift without additional costly components.

DETAILED DESCRIPTION

Figure 1:
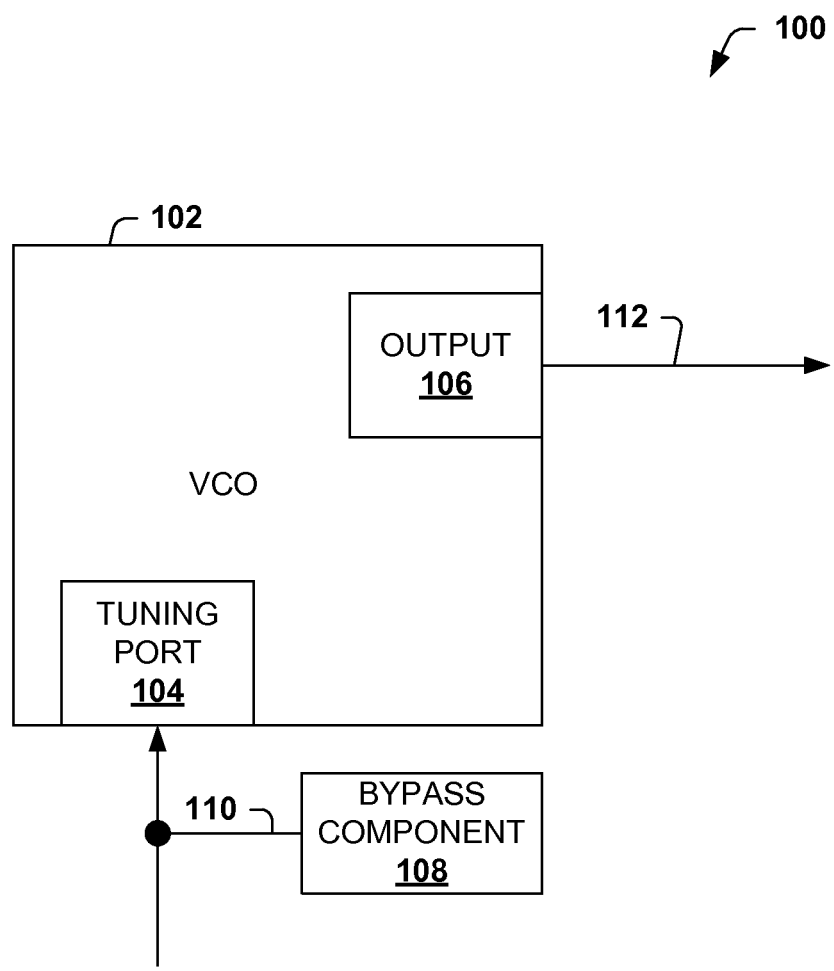
FIG. 1 is a block diagram illustrating a voltage controlled oscillator arrangement using a bypassed compensating signal.

The present invention will now be described with reference to the attached drawing figures, wherein like reference numerals are used to refer to like elements throughout, and wherein the illustrated structures and devices are not necessarily drawn to scale.

RF signal oscillators are used for applications including, but not limited to, communication systems, motion sensing, radar systems and the like. A typical RF oscillator is a voltage controlled oscillator (VCO). A requirement for unlocked RF signal oscillator arrangements is that they have a low or close to zero temperature dependence.

A typical VCO has temperature dependence and its operating frequency changes or drifts according to changes in temperature. This effect is referred to as temperature drift. The change in operating frequency can be represented by a temperature coefficient. Often, the temperature coefficient of a VCO is negative since the speed of the VCO transistors decreases when the temperature is increased. The tuning characteristic of the VCO is often positive, which means that its operating frequency is monotonically increasing with increasing tuning voltage. A compensating signal can be used to mitigate the temperature coefficient and temperature drive of the VCO by applying the compensating signal to a tuning input of the VCO. The compensating signal is generated by a component and has (in this special example case) positive to ambient temperature (PTAT) characteristics.

The compensating signal typically has some amount of noise. As a result, applying the compensating signal introduces unwanted frequency modulation of the VCO, resulting in phase noise in the generated oscillation signal of the VCO. In continuous wave operation mode, a low pass filter with a low cutoff frequency, such as below 1 kHz, can be used to attempt to remove noise in the compensating signal. However, applying the low pass filter may not be possible and/or may not remove a substantial amount of noise from the compensating signal. Also in (fast) pulsed operation mode a lowpass filtering with low cutoff frequency might not be applicable.

Another approach to account for temperature dependence is to use a phase locked loop (PLL) to stabilize the operating frequency of the VCO. The PLL can be used to lock the VOC to a quartz stabilized independent reference frequency. Alternatively, a microprocessor can be used to measure the VCO's operating frequency and adjust the VCO to correct its operating frequency. The above approaches require substantial additional effort beyond the VCO itself, which results in an increased bill of material, increased die area consumption and higher power consumption.

The systems, arrangements, methods and the like described below utilize a bypassed compensating signal that is only applied/generated during inactive portions of the VCO. As a result, impact of noise from the bypass compensating signal is mitigated.

FIG. 1 is a block diagram illustrating a voltage controlled oscillator arrangement 100 using a bypassed compensating signal. The arrangement 100 generates an output signal having a stable operating frequency with a low or zero temperature coefficient.

The arrangement 100 includes a voltage controlled oscillator (VCO) 102 and a bypass component 108. The VCO 102 is shown in simplified form and includes a tuning port 104 and an output 106. A tuning voltage is applied to the tuning port 104 to selectively configure the VCO operating frequency. The tuning voltage or characteristic is typically, but not necessarily, positive in that a higher applied tuning voltage results in a higher operating frequency. The output 106 supplies an oscillator output signal 112 at the VCO operating frequency specified by the tuning voltage. The output signal 112 has a substantially stable operating frequency and does not substantially drift with temperature changes.

The VCO 102 typically generates the output signal 112 with a duty cycle that mitigates power consumption. In one example, the output signal 112 is generated with a duty cycle on the order of 1:1000, where the VCO 102 is active during 1 micro second and is inactive for 999 microseconds. During the active portion, the output signal is high and during the inactive portion, the output signal is low. Less power is consumed during the inactive portion, so DC power consumption can be reduced by selecting the appropriate duty cycle.

The bypass component 108 applies a bypass compensating signal 110 to the VCO tuning port 104 during the active portions of the VCO 102. During the active period of the VCO 102, the bypass component 108 is inactive but the charged bypass capacitor provides a tuning signal to the VCO tuning port 104. Typically, the bypass component 108 includes a capacitor and has a large capacitance that maintains its voltage substantially constant during the active VCO period. The bypass compensating signal 110 is applied in the form of a voltage. The signal is generated only during the inactive portions of the VCO and is received and stored by the bypass component 108. The bypass compensating signal 110 provides temperature compensation, mitigates temperature drift and mitigates the temperature coefficient for the VCO 102. Additionally, as the component 110 is not charged during the active portions of the VCO, thus noise present in generating the signal is not passed on to the VCO tuning port 104 during the active portions.

In one example, the bypass component 108 includes one or more capacitors. The one or more capacitors can be configured in serial and/or parallel. Only a relatively small capacitance is needed due to the short duration of the active portions.

The temperature coefficient (TC) is mitigated, as described above, by the application of the bypass compensating signal 110 to the tuning port 104. The temperature coefficient is defined in terms of frequency change per change in temperature.

$$TC = \frac{df}{dT}$$

The TC is typically a positive value depending on the tuning element of the VCO. Applications or uses can require a minimum intrinsic temperature coefficient, which can be obtained by generating and using the bypass compensating signal 110. Additionally, the introduction of noise is mitigated due to the generation of the signal 110 only occurring when the VCO 102 is inactive.

Figure 2:
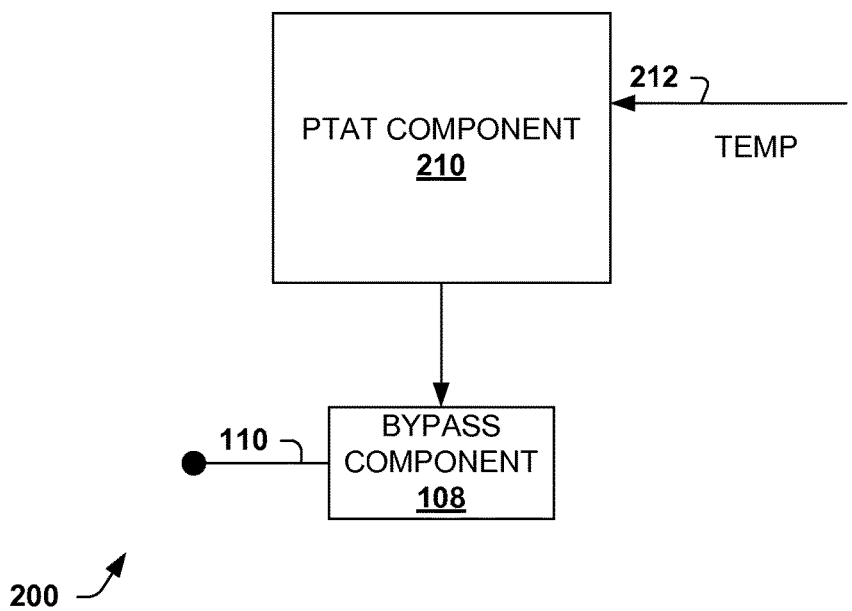
FIG. 2 is a block diagram illustrating a temperature compensating arrangement.

FIG. 2 is a block diagram illustrating a temperature compensating arrangement 200. The arrangement 200 provides a bypass compensating signal that is generated during inactive portions of a VCO and is applied, but not generated during the active portions of a VCO.

The arrangement 200 includes a bypass component 108 and a positive to ambient temperature (PTAT) component 210. The bypass component 108 provides a bypass compensating signal 110, which is applied to a tuning port of a VCO, such as described with regard to FIG. 1.

The PTAT component 210 senses or utilizes a temperature 212 to generate a PTAT compensating signal at its output. The temperature 212 can be expressed as an absolute value (K) or as a deviation from an ambient value. The PTAT component 210 is configured to vary the PTAT compensating signal according to temperature.

The PTAT component 210 may include circuitry such as, but not limited to one or more single-core or multi-core processors. The processor(s) can include a combination of general purpose processors and dedicated processors (e.g., graphics processors, application processors, etc.). The processor(s) can be coupled to a memory storage to enable various applications and/or operating systems.

A temperature compensation coefficient (TCC) is generated based on operation and/or performance of a VCO. The TCC can be determined via testing and/or mathematically. Typically, the operating frequency or speed of the VCO decreases as the temperature increases. Thus, the PTAT compensation requires increasing the voltage applied at the tuning port of the VCO in order to compensate for the increased temperature in this example. Similarly, the operating frequency or speed of the VCO increases as the temperature decreases. Thus, the PTAT compensation requires decreasing the voltage applied at the tuning port in order to compensate for the decreased temperature. The amount or change in the PTAT compensation is based on the TCC and the temperature or change in temperature. Additionally, it is noted that the tuning characteristic of a VCO is typically nonlinear whereas the output of a PTAT is typically linear. Optimum or better compensation of the VCO temperature drift can be achieved when the compensating signal has the inverse characteristic than the VCO.

The PTAT compensation is provided to the bypass component 108. In one example, the bypass component 108 uses the PTAT compensation to recharge up to the voltage of the PTAT compensation.

The PTAT component 210 is operational or active during inactive portions of the VCO and is inactive during active portions of the VCO. As a result, the bypass component 108 is charged during the inactive portions of the VCO.

When the bypass component 108 applies the bypass compensating signal 110, the PTAT component 210 is inactive. As a result, noise generated and/or present while the PTAT component 210 is active, is not present when the bypass compensating signal is applied. Thus, the generated noise is avoided and does not degrade operation of the VCO.

Various techniques can be used to disable or inactivate the PTAT component 210 while the VCO is active and to enable or activate the PTAT component 210 while the VCO is inactive. In one example, clock signals are connected to enable terminals of the VCO and the PTAT component 210. The signal for the PTAT component 210 is the inverse of the enable signal for the VCO. In another example, a VCC having a selected duty cycle is supplied to the VCO and an inverse of the supplied VCC is supplied to the PTAT component 210.

Figure 3:
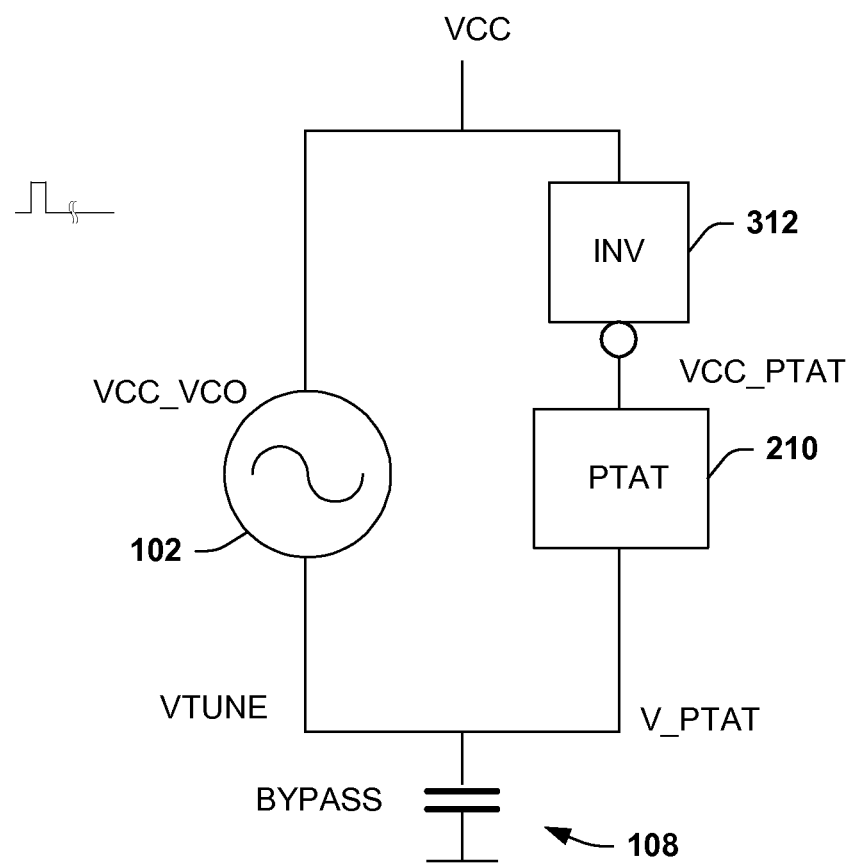
FIG. 3 is a diagram illustrating a VCO arrangement utilizing an inverse supply voltage for a PTAT component.

FIG. 3 is a diagram illustrating a VCO arrangement 300 utilizing an inverse supply voltage for a PTAT component. The arrangement 300 uses a bypass compensating signal in order to generate a VCO output signal having a stable operating frequency with a low or zero temperature coefficient.

The arrangement 300 includes a VCO 102, a bypass compensation component 108, a PTAT component 210 and a supply voltage inverter 312. The VCO 102 is supplied with a supply voltage VCC_VCO that has a duty cycle wherein the supply voltage is high or active for relatively short portions of the cycle and is low or inactive for relatively long portions of the cycle. In one example, the VCC_VCO is high or ON for 1 microsecond and is low or OFF for 999 microseconds for a 1:1000 duty cycle.

The supply voltage inverter 312 is configured to receive the VCC_VCO at its input and provide a PTAT supply voltage, VCC_PTAT, at its output. The VCC_PTAT is an inverse of the VCC_VCO. Thus, continuing the above example, the VCC_PTAT is low or OFF for 1 microsecond and is high or ON for 999 microseconds for a 1:1000 duty cycle.

The PTAT component 210 is active or inactive depending on VCC_PTAT. As a result, the PTAT component 210 is inactive when the VCO 102 is active and is active when the VCO 102 is inactive.

The bypass component 108, shown as a capacitor in this example, applies a bypass compensating signal to a tuner port of the VCO 102 when the VCO 102 is active and is charged by the PTAT component 210 when the VCO 102 is inactive and the PTAT component 210 is active.

Figure 4:
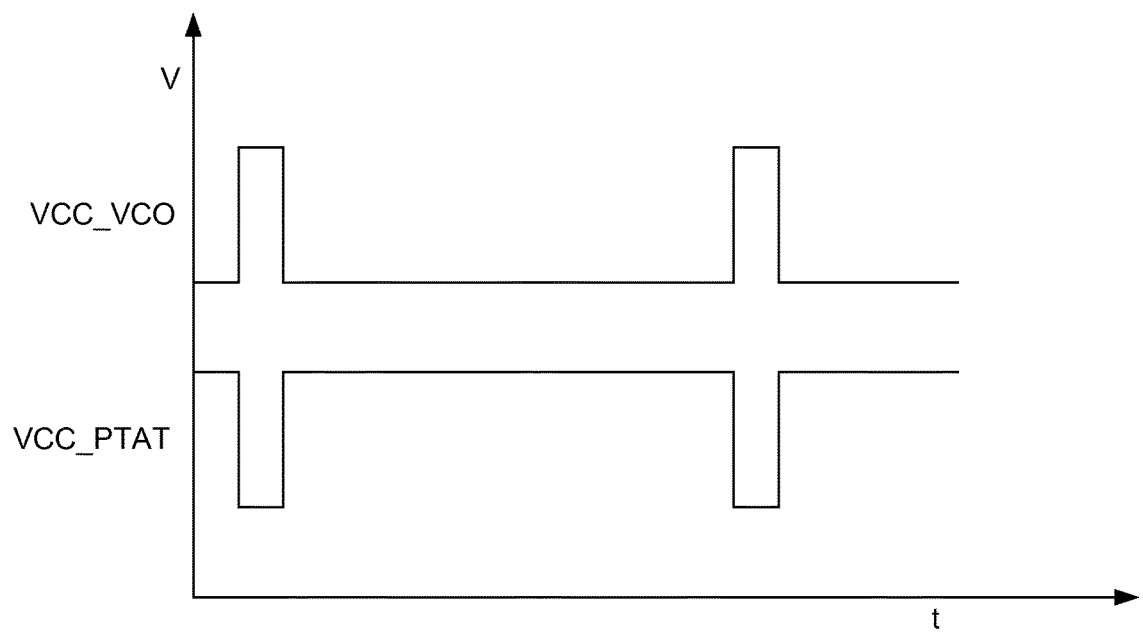
FIG. 4 is a timing diagram showing operation of the VCO arrangement and various supply voltages.

FIG. 4 is a timing diagram 400 showing operation of the VCO arrangement and various supply voltages. The diagram 400 is shown as an example and it is appreciated that other timings and duty cycle rations can be utilized.

The timing diagram 400 is shown with time (t) along an x-axis and volts (V) along a y-axis. A first supply is shown as VCC_VCO. This is the supply for the VCO 102 of FIG. 3. If the VCC_VCO is high or ON, the VCO is active and operating. If the VCC_VCO is low or OFF, the VCO is inactive. A second supply is shown as VCC_PTAT, which is the supply voltage for the PTAT component 210 of FIG. 3. If the VCC_PTAT is high or ON, the PTAT component 210 is active and if the VCC_PTAT is low or OFF, the PTAT component 210 is inactive.

The VCC_PTAT is inverted from the VCC_VCO, such as is done by the inverter component 312 of FIG. 3. The VCC_VCO is high or ON during active portions of the VCO and is low or OFF during inactive portions of the VCO. Thus, the VCC_PTAT is OFF when the VCO is active and the VCC_PTAT is ON when the VCO is inactive.

Figure 5:
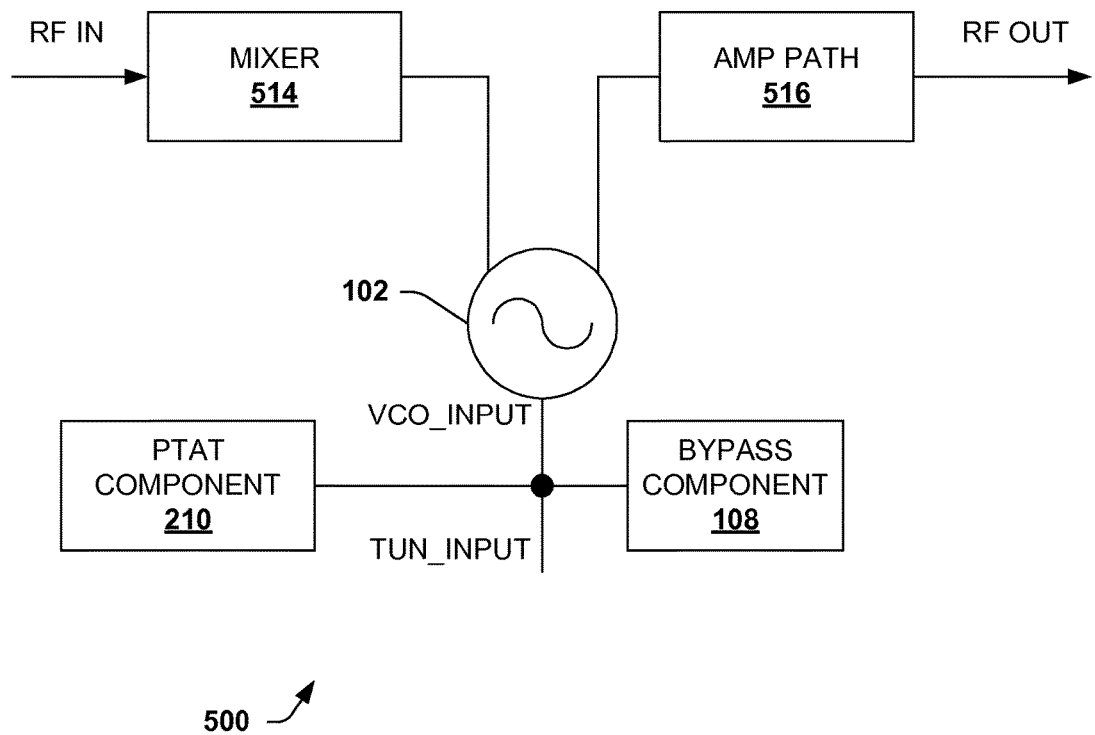
FIG. 5 is a simplified block diagram of an RF transceiver illustrating an RF signal generating arrangement using a bypassed compensating signal.

FIG. 5 is a block diagram illustrating an RF signal generating transceiver arrangement 500 using a bypass compensating signal. The arrangement 500 generates an RF output signal having a stable frequency with a low or zero temperature coefficient. The arrangement 500 can be used for motion detection, radar applications, object detection and the like. In one example, the arrangement 500 is used to generate a 24 GHz sensor signal. Other applications are contemplated.

The arrangement 500 includes a mixer path 514, an amplifier path 516, a VCO 102, a bypass component 108 and a PTAT component 210. Additional description for the components can be obtained by referencing the above description for like numbered components.

The mixer path 514 receives an input signal and performs downconversion to an intermediate frequency or directly to baseband. The output signal of the VCO 102 is provided to an amplification path, which amplifies and generates an RF output signal. The RF output signal can be used for sensor applications and the like.

The VCO 102 receives a tuning input (TUN_INPUT) in the form of a voltage at its input. The TUN_INPUT is set to a value that corresponds to a selected operating frequency for the VCO output signal.

The PTAT component 210 generates a PTAT compensating signal based on a sensed or measured temperature and the TUN_INPUT. The compensating signal includes a voltage adjustment to the TUN_INPUT that compensates for changes in temperature. However, the PTAT compensating signal is not applied to the VCO input while the VCO 102 is active. It is appreciated that in one application, the bypass component 108 is continuously connected to the tuning port of the VCO. The PTAT component 210 is only active during inactive portions of the VCO 102. As a result, signal noise generated by the PTAT component 210 is not provided to the VCO 102 and does not degrade the RF output signal.

The bypass component 108 is charged according to the PTAT compensating signal during inactive portions of the VCO 102. The bypass component 108 is configured to apply a bypass compensating voltage the VCO input during the active portions of the VCO 102.

The VCO 102 and the PTAT component 210 are configured to operate inversely such that the PTAT component 210 is inactive when the VCO 102 is active and the PTAT component 210 is active when the VCO 102 is inactive. One suitable technique is to use a divider circuit to generate a supply voltage (VCC_VCO) for the VCO 102 that turns the VCO 102 ON and OFF. An inverter then inverts the VCC_VCO to generate a VCC_PTAT, which supplies power to the PTAT component 210.

The bypass component 108 can be a passive or active charge storing device. In one example, the bypass component 108 is a capacitor.

Figure 6:
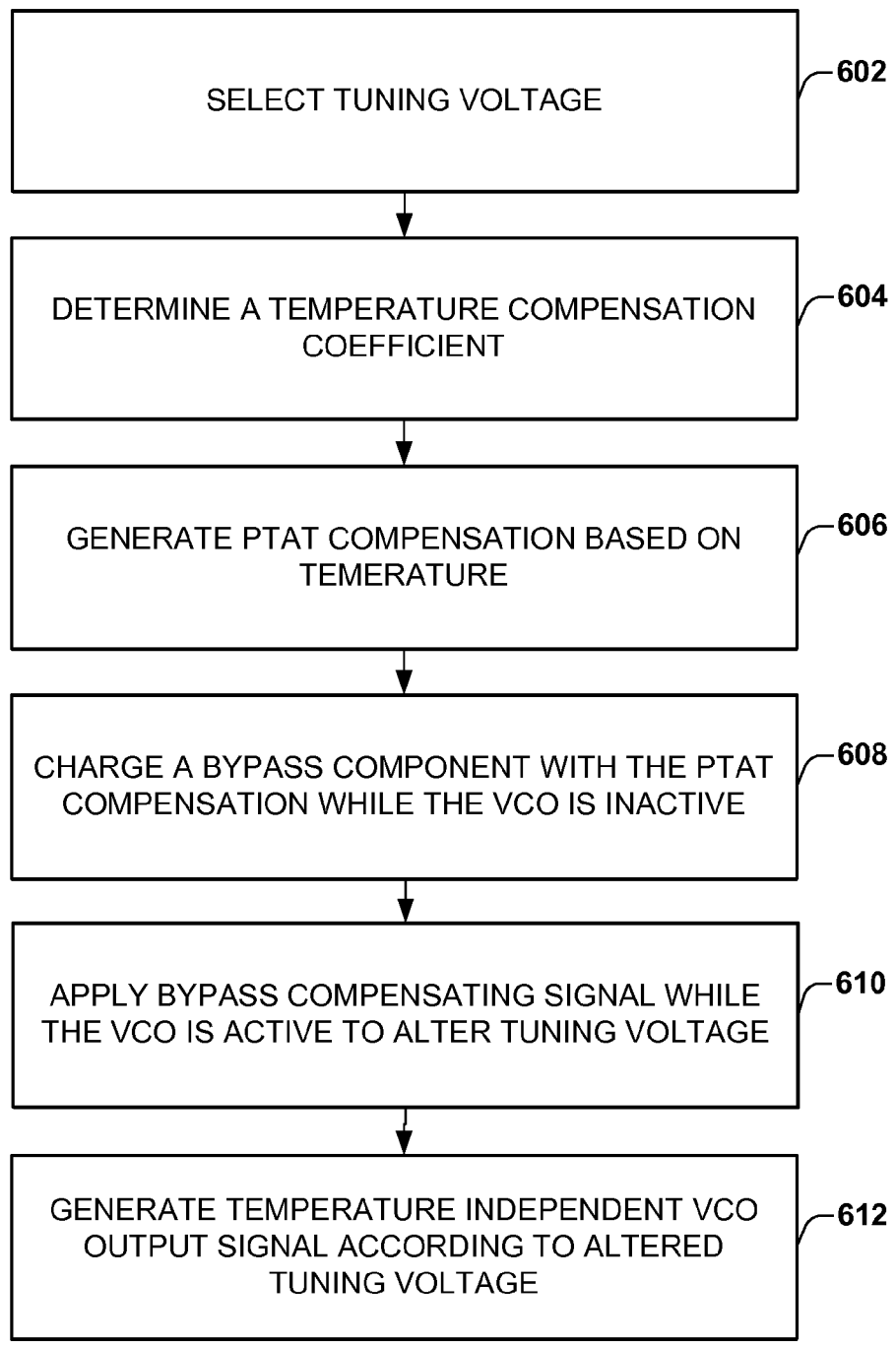
FIG. 6 is a flow diagram illustrating a method of operating a voltage controlled oscillator having a low or zero temperature coefficient.

FIG. 6 is a flow diagram illustrating a method 600 of operating a voltage controlled oscillator having a low or zero temperature coefficient. The method generates an output signal at a stable operating frequency that is substantially independent of a current temperature and/or changes in temperature.

The method 600 begins at block 602, where a tuning voltage is selected and applied to a tuning input of a voltage controlled oscillator. The tuning voltage is selected according to a required or desired operating frequency. The tuning voltage is applied to the tuning input.

A positive to ambient temperature (PTAT) component determines a temperature compensation coefficient (TCC) for the voltage controlled oscillator at block 604. The TCC can be generated by measuring output frequencies for a selected frequency at a variety of temperatures. Other suitable mechanisms for determining and/or developing the TCC can be used. The TCC represents a change in frequency for a change in temperature.

The PTAT component determines and generates a PTAT compensation based on the temperature compensation coefficient and a current temperature at block 606. The PTAT compensation accounts for variations of operating frequency of the voltage controlled oscillator due to temperature. As shown above, an increase in temperature tends to decrease the uncompensated operating frequency and a decrease in temperature tends to increase the uncompensated operating frequency.

The PTAT compensation is typically generated only during inactive portions of the voltage controlled oscillator. When generated, the PTAT compensation can include unwanted noise. This noise, if applied to the tuning input of the voltage controlled oscillator, could degrade the output and/or introduce unwanted frequency changes. During the inactive portions of the voltage controlled oscillator, the VCO is inactive and noise present in the PTAT compensation does not impact its operation.

A bypass component is charged during the inactive portion of the VCO at block 608. The bypass component is charged by the PTAT compensation. In one example, the bypass component is or includes one or more capacitors suitably arranged. The PTAT compensation charges the bypass component to a voltage level, which can be less than or greater than the tuning voltage.

A bypass compensating signal is applied by the bypass component, which maintains the tuning voltage substantially constant during an active portion of the VCO at block 610. At this point, the PTAT component is disabled or inactive and, as a result, does not contribute noise to the VCO.

The VCO generates a VCO output signal according to the altered tuning voltage at block 612. The output signal is generated independent of temperature and/or variations from an ambient temperature.

While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the systems, arrangements and the like shown in FIGS. 1, 2, etc., are non-limiting examples that may be used to implement the above methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

A voltage controlled oscillator arrangement is disclosed. The arrangement includes a voltage controlled oscillator and a bypass component. The voltage controlled oscillator has an output and a tuning port. The output provides an output signal at an operating frequency. The tuning port is configured to select the operating frequency according to an applied voltage. The voltage controlled oscillator has active portions and inactive portions. During the active portions, the output signal is at a non-zero value. The bypass component is configured to apply a bypass compensating signal to the tuning port during the active portions of the voltage controlled oscillator. The bypass compensating signal compensates for an oscillator temperature of the voltage controlled oscillator.

In one variation of the arrangement, the bypass component is charged only during the inactive portions of the voltage controlled oscillator.

In another variation, the arrangement further includes a positive to ambient temperature component configured to generate and provide a PTAT compensation to the bypass component only during the inactive portions of the voltage controlled oscillator.

A sensor arrangement having a low temperature coefficient is disclosed. The arrangement includes a mixer path, a voltage controlled oscillator, an amplifier path, a bypass component, and a PTAT component. The mixer path is configured to receive an input signal and generate a mixed signal from the input signal. The voltage controlled oscillator is configured to generate an oscillator output based on the mixed signal and an oscillator input voltage. The amplifier path is configured to generate an output signal from the oscillator output. The bypass component is configured to apply a bypass compensating signal to the oscillator input voltage during an active portion of the voltage controlled oscillator. The PTAT component is configured to generate a PTAT compensation and charge the bypass component with the PTAT compensation during an inactive portion of the voltage controlled oscillator.

In one example, the bypass component includes a capacitor.

A method of operating an oscillator having a low temperature coefficient is disclosed. A tuning voltage for an operating frequency is applied to a tuning input of a voltage controlled oscillator. A temperature compensation coefficient is determined for the voltage controlled oscillator. A PTAT component determines and generates a PTAT compensation based on the temperature compensation coefficient and a current temperature. A bypass component is charged by the PTAT compensation during an inactive portion of the voltage controlled oscillator. A bypass compensating signal is applied to the tuning port by the bypass component. A voltage controlled oscillator output signal is generated by the voltage controlled oscillator. The operating frequency of the output signal is independent of the current temperature.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A voltage controlled oscillator arrangement comprising:
   a voltage controlled oscillator having an output and a tuning port, wherein the output provides an output signal at an operating frequency, the tuning port is configured to select the operating frequency of the output signal according to an applied voltage, the voltage controlled oscillator is supplied by a supply voltage, wherein the supply voltage is OFF during inactive portions of a cycle and the supply voltage is ON during active portions of the cycle;
   a bypass component configured to apply a bypass compensating signal to the tuning port during the active portions of the cycle and the bypass component is configured to be charged during the inactive portions of the cycle, wherein the bypass compensating signal compensates for an oscillator temperature of the voltage controlled oscillator; and
   wherein the bypass component is configured to have a positive to ambient temperature (PTAT) compensation applied only during the inactive portions of the cycle for the supply voltage of the voltage controlled oscillator.

2. The arrangement of claim 1, wherein the bypass component is a passive component.

3. The arrangement of claim 1, wherein a duty cycle of the supply voltage for the voltage controlled oscillator is configured to mitigate power consumption and the active portions are shorter than the inactive portions.

4. A voltage controlled oscillator arrangement comprising:
   a voltage controlled oscillator having an output and a tuning port, wherein the output provides an output signal at an operating frequency, the tuning port is configured to select the operating frequency of the output signal according to an applied voltage, the voltage controlled oscillator is supplied by a supply voltage, wherein the supply voltage is OFF during inactive portions of a cycle and the supply voltage is ON during active portions of the cycle;

a bypass component configured to apply a bypass compensating signal to the tuning port during the active portions of the cycle and the bypass component is configured to be charged during the inactive portions of the cycle, wherein the bypass compensating signal compensates for an oscillator temperature of the voltage controlled oscillator; and a positive to ambient temperature (PTAT) component configured to generate and provide a PTAT compensation to the bypass component only during the inactive portions of the cycle for the supply voltage of the voltage controlled oscillator.

5. The arrangement of claim 4, wherein the PTAT component is disabled during the active portions of the cycle for the supply voltage of the voltage controlled oscillator.

6. The arrangement of claim 4, wherein the PTAT component determines a temperature compensation coefficient for the voltage controlled oscillator.

7. The arrangement of claim 4, wherein the PTAT component is configured to generate the PTAT compensation according to the oscillator temperature.

8. The arrangement of claim 4, wherein the PTAT component is disabled by a disable/enable signal applied to an enable terminal of the PTAT component.

9. The arrangement of claim 4, wherein the PTAT component is supplied by a PTAT supply voltage.

10. The arrangement of claim 9, further comprising an inverter to invert the supply voltage for the voltage controlled oscillator to the PTAT supply voltage for the PTAT component.

11. A sensor arrangement having a low temperature coefficient comprising:
    a mixer path configured to receive an input signal and generate a mixed signal from the input signal;
    a voltage controlled oscillator configured to generate an oscillator output based on an oscillator input voltage, wherein the voltage controlled oscillator is supplied by a supply voltage, where the supply voltage is OFF during inactive portions of a cycle and is ON during active portions of the cycle;
    an amplifier path configured to generate an output signal from the oscillator output;
    a bypass component configured to apply a bypass compensating signal to the oscillator input voltage during the active portions of the cycle for the supply voltage of the voltage controlled oscillator; and
    a positive to ambient temperature (PTAT) component configured to generate a PTAT compensation and charge the bypass component with the PTAT compensation during the inactive portions of the cycle for the supply voltage of the voltage controlled oscillator, wherein the PTAT component is disabled during the active portions of the cycle for the supply voltage of the voltage controlled oscillator.

12. The arrangement of claim 11, wherein the oscillator output is at a stable operating frequency independent of a temperature of the voltage controlled oscillator.

13. The arrangement of claim 11, wherein the bypass component includes a capacitor.

14. The arrangement of claim 11, wherein the bypass compensating signal of the bypass component modifies the oscillator input voltage by a compensating voltage that compensates for temperature drift.

15. A method of operating an oscillator, the method comprising:
    applying a tuning voltage to an input of the oscillator according to an operating frequency;
    determining a temperature compensation coefficient for the oscillator;
    determining and generating a positive to ambient temperature (PTAT) compensation based on the temperature compensation coefficient and a current temperature of the oscillator during an inactive portion of a cycle for a supply voltage of the oscillator;
    providing the supply voltage to the oscillator, wherein the supply voltage is OFF during the inactive portion of the cycle and the supply voltage is ON during an active portion of the cycle;
    charging a bypass component only during the inactive portion of the cycle for the supply voltage of the oscillator by the PTAT compensation; and
    applying a bypass compensating signal to a tuning port of the oscillator by the bypass component to compensate for temperature variations of the oscillator.

16. The method of claim 15, wherein the bypass component determines the temperature compensation coefficient based on testing an oscillator output at various temperatures.

17. The method of claim 15, wherein generating the PTAT compensation includes introducing noise in the PTAT compensation.

18. The method of claim 17, wherein the bypass compensating signal is free of the introduced noise.

* * * * *